(12) United States Patent
Kocon

(10) Patent No.: US 6,198,127 B1
(45) Date of Patent: Mar. 6, 2001

(54) MOS-GATED POWER DEVICE HAVING EXTENDED TRENCH AND DOPING ZONE AND PROCESS FOR FORMING SAME

(75) Inventor: Christopher B. Kocon, Plains, PA (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/314,323

(22) Filed: May 19, 1999

(51) Int. Cl.[7] .................................................. H01L 31/113
(52) U.S. Cl. .......................... 257/328; 257/329; 257/330
(58) Field of Search .................................... 257/330, 328, 257/329; 438/259, 270, 271, 589, 212, 268

(56) References Cited

U.S. PATENT DOCUMENTS

| 5,216,275 | | 6/1993 | Chen . | |
|---|---|---|---|---|
| 5,341,011 | * | 8/1994 | Hshieh et al. | 257/330 |
| 5,436,189 | * | 7/1995 | Beasom | 437/67 |
| 5,438,215 | | 8/1995 | Tihanyi . | |
| 5,473,176 | * | 12/1995 | Kakumoto | 257/192 |
| 5,474,943 | * | 12/1995 | Hshieh et al. | 437/40 |
| 5,629,543 | * | 5/1997 | Hshieh et al. | 257/330 |
| 5,689,128 | * | 11/1997 | Hshieh et al. | 257/331 |
| 5,770,878 | * | 6/1998 | Beasom | 257/330 |
| 5,917,216 | * | 6/1999 | Floyd et al. | 257/330 |
| 5,929,481 | * | 7/1999 | Hshieh et al. | 257/328 |

* cited by examiner

Primary Examiner—Mahshid Saadat
Assistant Examiner—Eugene Lee
(74) Attorney, Agent, or Firm—Jaeckle Fleischmann & Mugel, LLP

(57) ABSTRACT

A trench MOS-gated device comprises a doped monocrystalline semiconductor substrate that includes an upper layer and is of a first conduction type. An extended trench in the upper layer of the substrate has a bottom portion filled with a dielectric material that forms a thick layer in the bottom of the trench. The upper portion of the trench is lined with a dielectric material and substantially filled with a conductive material, the filled upper portion of the trench forming a gate region. An extended doped zone of a second opposite conduction type extends from the upper surface into the upper layer on one side of the trench, and a doped well region of the second conduction type overlying a drain zone of the first conduction type is disposed in the upper layer on the opposite side of the trench. The drain zone is substantially insulated from the extended zone by the thick dielectric layer in the bottom portion of the trench. A heavily doped source region of the first conduction type and a heavily doped body region of the second conduction type is disposed in the well region at the upper surface of the upper layer. An interlevel dielectric layer is disposed on the upper surface overlying the gate and source regions, and a metal layer overlying the upper surface and the interlevel dielectric layer is in electrical contact with the source and body regions and the extended zone. A process for constructing a trench MOS-gated device comprises forming an extended trench in an upper layer of a doped monocrystalline semiconductor substrate of a first conduction type, and substantially filling the trench with a dielectric material. A dopant of a second opposite conduction type is implanted and diffused into the upper layer on one side of the extended trench to form a doped extended zone extending into the upper layer from its upper surface. A selected portion of the dielectric material is removed from an upper portion of the trench, leaving a thick dielectric layer in its bottom portion. Sidewalls comprising dielectric material are formed in the upper portion of the trench, which is then substantially filled with a conductive material to form a gate region in the upper portion of the trench. A doped well region of the second conduction type is formed in the upper layer on the side of the trench opposite the doped extended zone. Heavily doped source and body regions are formed in the well region, and an interlevel dielectric layer is deposited on the upper surface overlying the gate and source regions. A metal layer in electrical contact with the source and body regions and the extended zone is formed over the substrate upper surface and the interlevel dielectric layer.

14 Claims, 3 Drawing Sheets

MOS-GATED POWER DEVICE HAVING EXTENDED TRENCH AND DOPING ZONE AND PROCESS FOR FORMING SAME

FIELD OF THE INVENTION

The present invention relates to semiconductor devices and, more particularly, to a trench MOS-gated power device having an extended doped zone separated from a drain zone by an extended trench.

BACKGROUND OF THE INVENTION

An MOS transistor having a trench gate structure offers important advantages over a planar transistor for high current, low voltage switching applications. The DMOS trench gate typically includes a trench extending from the source to the drain and having sidewalls and a floor that are each lined with a layer of thermally grown silicon dioxide. The lined trench is filled with doped polysilicon. The structure of the trench gate allows less constricted current flow and, consequently, provides lower values of specific on-resistance. Furthermore, the trench gate makes possible a decreased cell pitch in an MOS channel extending along the vertical sidewalls of the trench from the bottom of the source across the body of the transistor to the drain below. Channel density is thereby increased, which reduces the contribution of the channel to on-resistance. The structure and performance of trench DMOS transistors are discussed in Bulucea and Rossen, "Trench DMOS Transistor Technology for High-Current (100 A Range) Switching," in *Solid-State Electronics,* 1991, Vol. 34, No. 5, pp 493–507, the disclosure of which is incorporated herein by reference. In addition to their utility in DMOS devices, trench gates are also advantageously employed in insulated gate bipolar transistors (IGBTs), MOS-controlled thyristors (MCTs), and other MOS-gated devices.

FIG. 1 schematically depicts the cross-section of a trench-gated N-type MOSFET device 100 of the prior art formed on an upper layer 101a of an N+ substrate 101. Device 100 includes a trench 102 whose sidewalls 104 and floor 103 are lined with a gate dielectric such as silicon dioxide. Trench 102 is filled with a conductive material 105 such as doped polysilicon, which serves as an electrode for gate region 106.

Upper layer 101a of substrate 101 further includes P-well regions 107 overlying an N-drain zone 108. Disposed within P-well regions 107 at an upper surface 109 of upper layer 101a are heavily doped P+ body regions 110 and heavily doped N+ source regions 111. An interlevel dielectric layer 112 is formed over gate region 106 and source regions 111. Contact openings 113 enable metal layer 114 to contact body regions 110 and source regions 111. The rear side 115 of N+ substrate 101 serves as a drain.

Although FIG. 1 shows only one MOSFET, a typical device currently employed in the industry consists of an array of them arranged in various cellular or stripe layouts. As a result of recent semiconductor manufacturing improvements enabling increased densities of trench gated devices, the major loss in a device when in a conduction mode occurs in its lower zone, i.e., increased drain resistivity. Because the level of drain doping is typically determined by the required voltage blocking capability, increased drain doping for reducing resistivity is not an option. Thus, there is a need for reducing the resistivity of the drain region in a semiconductor device without also reducing its blocking capability. The present invention meets this need.

SUMMARY OF THE INVENTION

The present invention is directed to a trench MOS-gated device that comprises a doped monocrystalline semiconductor substrate that includes an upper layer and is of a first conduction type. An extended trench in the substrate has a bottom portion filled with a dielectric material that forms a thick layer in the bottom of the trench. The upper portion of the trench is lined with a dielectric material and substantially filled with a conductive material, the filled upper portion of the trench forming a gate region.

An extended doped zone of a second opposite conduction type extends from an upper surface into the upper layer of the substrate on one side of the trench, and a doped well region of the second conduction type overlying a drain zone of the first conduction type is disposed in the upper layer on the opposite side of the trench. The drain zone is substantially insulated from the extended zone by the thick dielectric layer in the bottom portion of the trench.

A heavily doped source region of the first conduction type and a heavily doped body region of the second conduction type is disposed in the well region at the upper surface of the upper layer. An interlevel dielectric layer is disposed on the upper surface overlying the gate and source regions, and a metal layer disposed on the upper surface of the upper layer and the interlevel dielectric layer is in electrical contact with the source and body regions and the extended zone.

The present invention is further directed to a process for constructing a trench MOS-gated device that comprises forming an extended trench in an upper layer of a doped monocrystalline semiconductor substrate of a first conduction type, and substantially filling the trench with a dielectric material. A dopant of a second opposite conduction type is implanted and diffused into the upper layer on one side of the extended trench, thereby forming a doped extended zone extending into the upper layer from its upper surface.

A selected portion of the dielectric material is removed from an upper portion of the trench, leaving a thick dielectric layer in its bottom portion. Sidewalls comprising dielectric material are formed in the upper portion of the trench, which is then substantially filled with a conductive material, thereby forming a gate region in the upper portion of the trench.

A doped well region of the second conduction type is formed in the upper layer of the substrate on the side of the trench opposite the doped extended zone. A heavily doped source region of the first conduction type and a heavily doped body region of the second conduction type are formed in the well region at the upper surface of the upper layer. An interlevel dielectric layer is deposited on the upper surface overlying the gate and source regions, and a metal layer is formed over the upper surface and the interlevel dielectric layer, the metal layer being in electrical contact with the source and body regions and the extended zone.

DETAILED DESCRIPTION OF THE INVENTION

Figure 1:
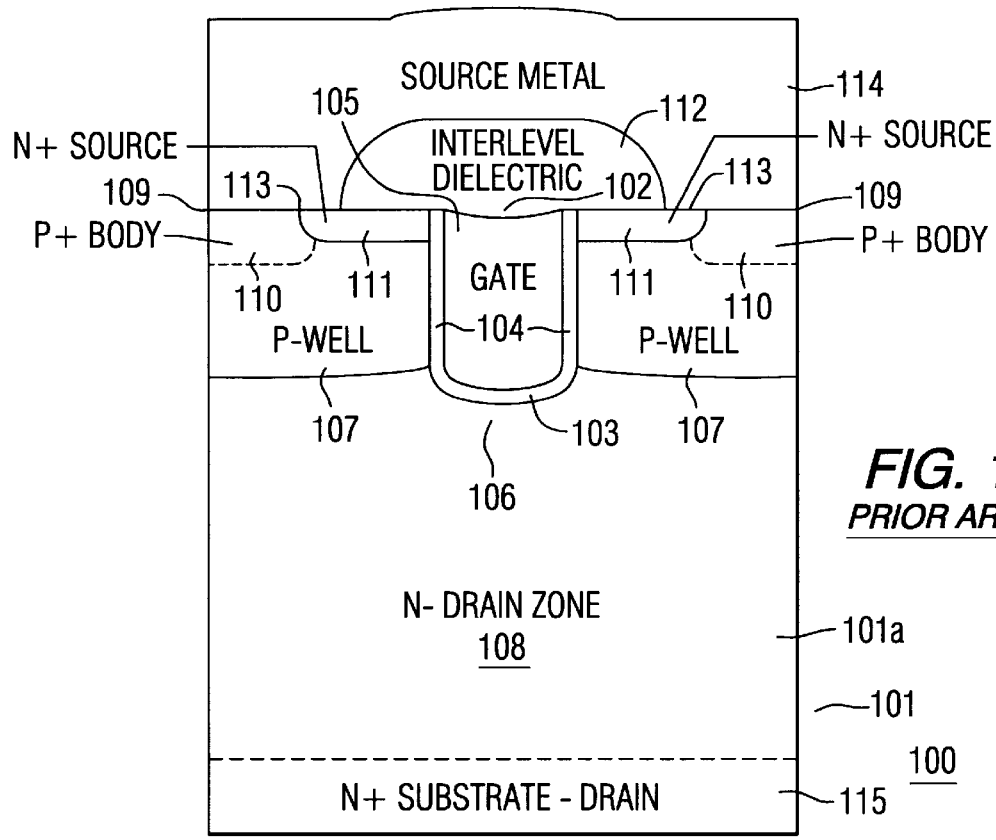
FIG. 1 schematically depicts a cross-section of a trench MOS-gated device 100 of the prior art.
Figure 2:
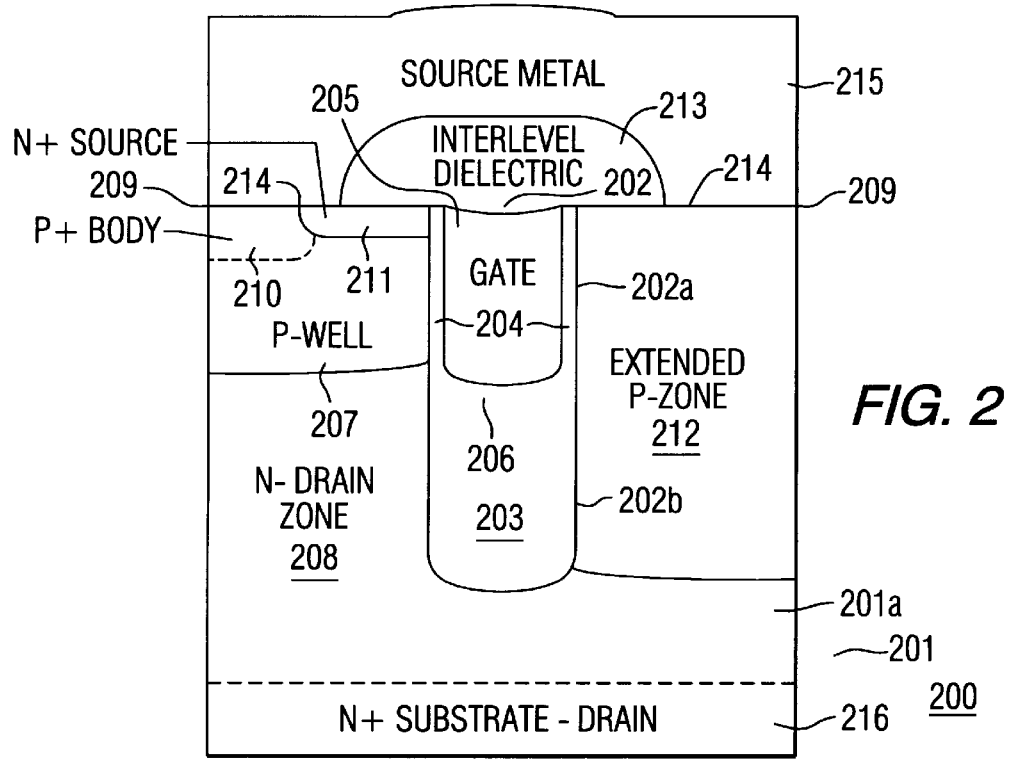
FIG. 2 is a schematic cross-sectional representation of a trench MOS-gated device 200 of the present invention.

In FIG. 2 is schematically depicted the cross-section of an MOS-gated power device 200 of the present invention. In an upper layer 201a of a substrate 201 is constructed an extended trench 202 that is partially filled with dielectric material 203. The upper portion 202a of extended trench 202 is lined with dielectric sidewalls 204 and filled with conductive material 205. Dielectric material 203 and sidewalls 204 can be silicon dioxide, and conductive material 205 can be doped polysilicon. Conductive material 205 insulated by dielectric material 203 and sidewalls 204 serves as an electrode for a gate region 206 in the upper portion of extended trench 202.

On one side of extended trench 202 is a P-well region 207 overlying an N-drain zone 208. Disposed within P-well region 207 at upper surface 209 is a heavily doped P+ body region 210 and a heavily doped N+ source region 211. On the other side of extended trench 202 is an extended P-zone 212. Extended trench 202 separates extended zone 212 from drain zone 208, which are of opposite conduction types. An interlevel dielectric layer 213 is formed over gate region 206, source region 211, and extended P-zone 212. Contact openings 214 enable metal layer 215 to contact body and source regions 210 and 211, respectively. The rear side 216 of substrate 201 serves as a drain.

Extended P-zone 212 serves to deplete charge when blocking voltage is applied, allowing a much higher conductivity material to be used for drain construction and thereby reducing the on-resistance of the device and improving its efficiency. Dielectric material 203 in bottom trench portion 202b, which can beneficially be narrower than upper trench portion 202a, prevents lateral diffusion of dopants from extended P-zone 212 into N-drain zone 208. Extended P-zone 212, which is thus self-aligned with gate region 206, is shorted to source region 211 by metal layer 215. Self-alignment allows the use of structure 200 for making high density devices with blocking voltage capabilities well below 100 V. Since dielectric material 203 serves only as a barrier to dopant diffusion, its quality is not important to the performance of device 200, which would still function even if zones 208 and 212 were electrically shorted through dielectric material 203. When device 200 is in the blocking state, zones 208 and 212 will contribute charges with opposite signs, but the induced fields in both zones will cancel out. This allows the use of much higher doping for extended P-zone 212 and particularly for N-drain zone 208. Current flowing through drain zone 208 thereby undergoes a much lower resistance drop, which in turn reduces the device overall on-resistance and improves its efficiency.

Although the described device is an N-channel silicon device, the present invention can also be applied to other devices and other semiconductor materials and dopants. For example, the described conduction types can be reversed, N for P and P for N. The described device is a power MOSFET, but the present invention is contemplated as applying to all MOS-gated devices such as, for example, IGBTs and MCTs.

Figure 2A:
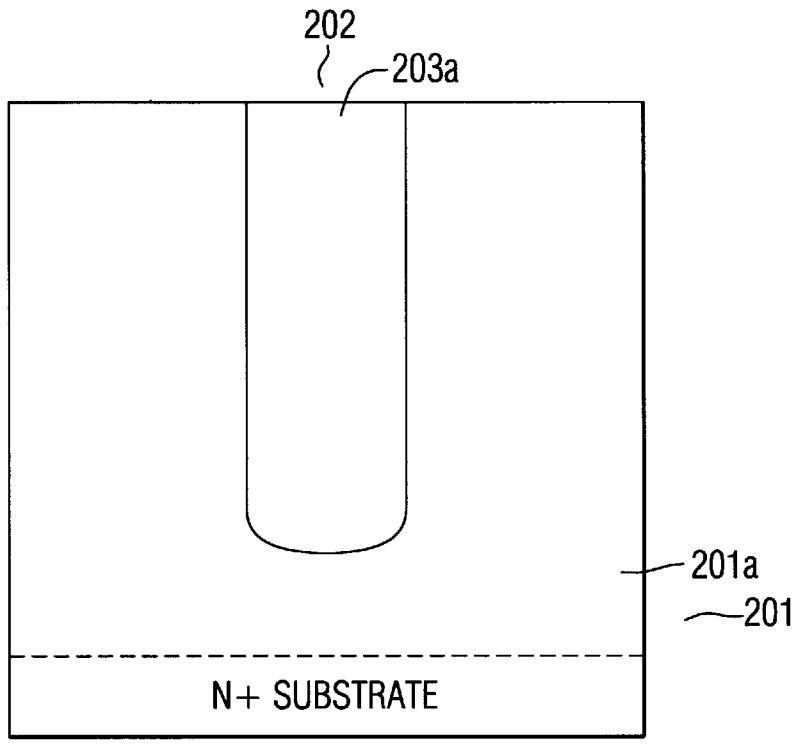
FIGS. 2A–D schematically depict a process for forming device 200 of the present invention.
Figure 2B:
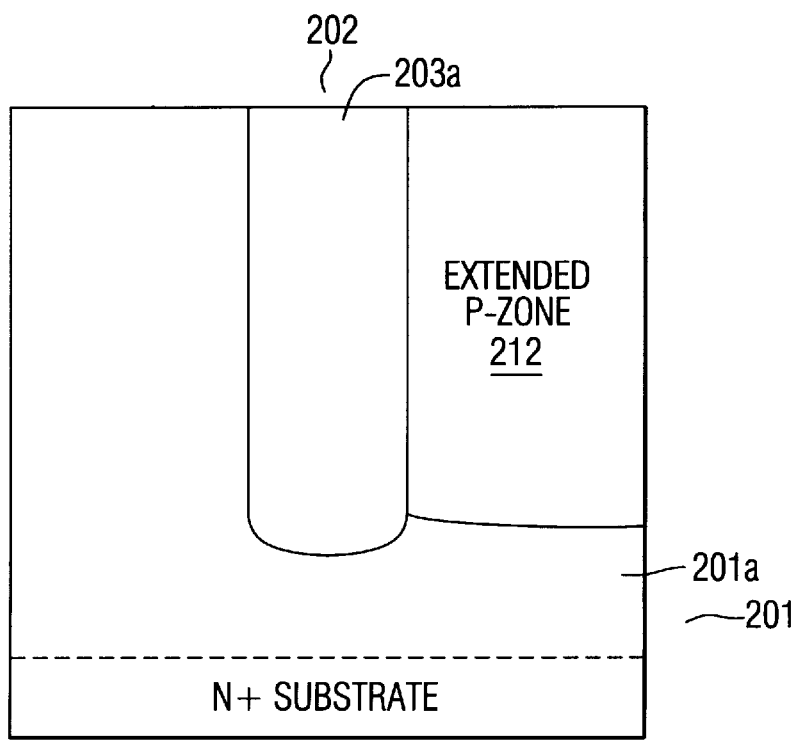

A process for making MOS-gated device 200 of the present invention is schematically depicted in FIGS. 2A–D. As shown in FIG. 2A, extended trench 202 is etched into upper layer 201a of substrate 201 and substantially filled with dielectric material 203a, preferably oxide. A planarization etch step can be used to planarize the oxide 203a with upper surface 209 of upper layer 201a. A P-dopant is selectively implanted, using standard photolithography techniques, on one side of trench 202. High temperature diffusion drives the dopant deep into layer 201a, thereby forming extended P-zone 212, as depicted in FIG. 2B.

Figure 2C:
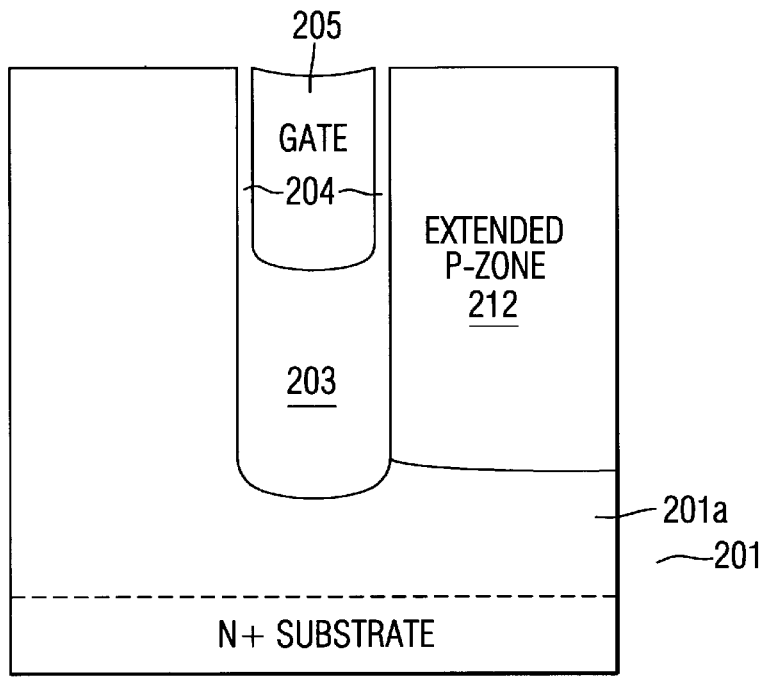
Figure 2D:
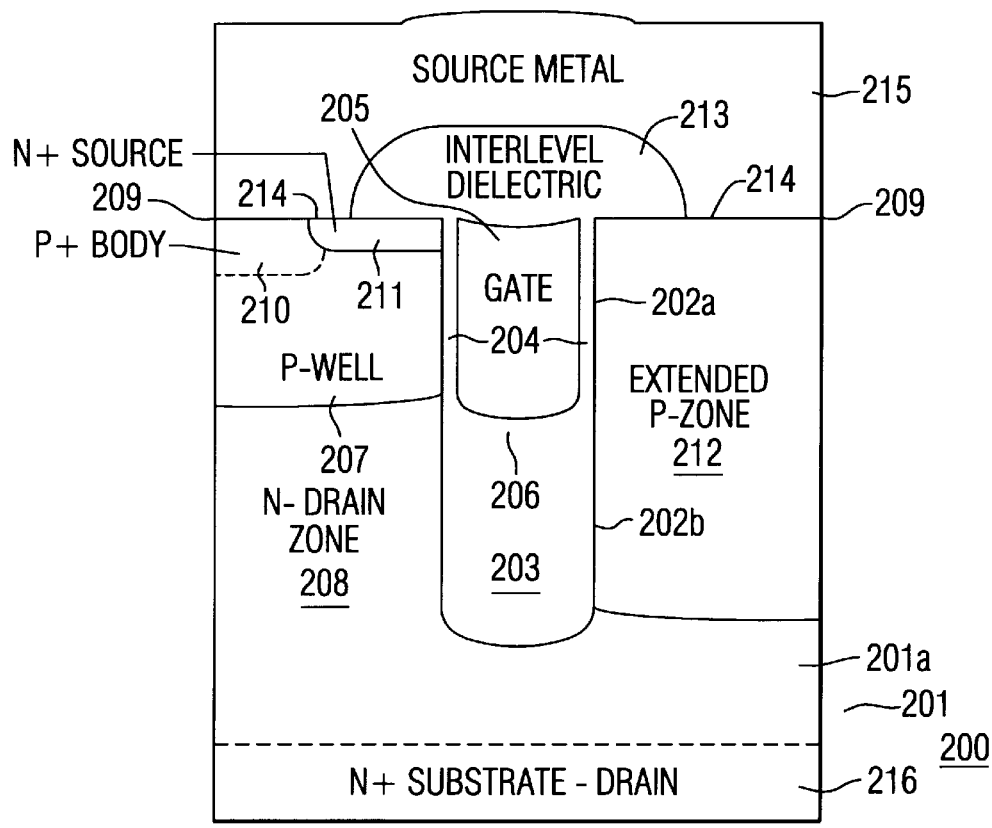

Dielectric layer 203a is recessed below upper surface 209 to a selected depth using dry etching techniques, leaving thick oxide layer 203 in the bottom portion of trench 202. Dielectric oxide sidewalls 204 are formed in the upper portion of trench 202, which is then substantially filled with conductive polysilicon 205, as shown in FIG. 2C. P-well region 207 is implanted into upper layer 201a on the side of trench opposite that of extended P-zone 212, and P+ body region 210 and N+ source region 211 are implanted into well region 207. Deposition of interlevel dielectric layer 213 and metal layer 215 and formation of contact openings 214 completes the fabrication of device 200, as depicted in FIG. 2D.

Variations of the described specific process flow are contemplated as being within the present invention. The sequence of trench creation, implantation and etch, for example, can be altered without affecting the final device function and layout.

Although the embodiment described above is an MOS power device, one skilled in the art may adapt the present invention to other devices, including insulated gate bipolar transistors and MOS-controlled thyristors.

The invention has been described in detail for the purpose of illustration, but it is understood that such detail is solely for that purpose, and variations can be made therein by those skilled in the art without departing from the spirit and scope of the invention, which is defined by the following claims.

What is claimed:

1. A trench MOS-gated device comprising:
   a substrate including an upper layer, said substrate comprising doped monocrystalline semiconductor material of a first conduction type;
   an extended trench in said upper layer, said trench having a bottom portion filled with a dielectric material, said material forming a dielectric layer in said bottom portion of said trench, said trench further having an upper portion lined with a dielectric material and substantially filled with a conductive material, said filled upper portion of said trench forming a gate region;
   a doped extended zone of a second opposite conduction type extending from an upper surface into said upper layer only on one side of said trench;
   a doped well region of said second conduction type overlying a drain zone of said first conduction type in said upper layer on the opposite side of said trench, said drain zone being substantially insulated from said extended zone by said dielectric layer in said bottom portion of said trench;
   a heavily doped source region of said first conduction type and a heavily doped body region of said second conduction type disposed at said upper surface in said well region only on the side of said trench opposite said doped extended zone;
   an interlevel dielectric layer on said upper surface overlying said gate and source regions; and
   a metal layer overlying said upper surface and said interlevel dielectric layer, said metal layer being in electrical contact with said source and body regions and said extended zone.

2. The device of claim 1 further comprising:
   a doped drain zone of said first conduction type extending through said upper layer and into said substrate beneath said well region and said extended zone.

3. The device of claim 2 further comprising:
   a heavily doped drain zone of said first conduction type disposed at a lower surface of said substrate.

4. The device of claim 1 wherein said doped extended zone extends into said upper layer to a depth substantially equal to the depth of the bottom of said trench.

5. The device of claim 1 wherein said portion of said extended trench is narrower than said upper portion.

6. The device of claim 1 wherein said upper layer is an epitaxial layer.

7. The device of claim 1 wherein said substrate comprises monocrystalline silicon.

8. The device of claim 1 wherein said dielectric material comprises silicon dioxide.

9. The device of claim 1 wherein said conductive material in said trench comprises doped polysilicon.

10. The device of claim 1 wherein said first conduction type is N and said second conduction type is P.

11. The device of claim 1 wherein said device comprises a plurality of extended trenches.

12. The device of claim 11 wherein said plurality of extended trenches have an open-cell stripe topology.

13. The device of claim 11 wherein said plurality of extended trenches have a closed-cell cellular topology.

14. The device of claim 1 selected from the group consisting of a power MOSFET, an insulated gate bipolar transistor, and an MOS-controlled thyristor.

* * * * *